(12) United States Patent
Minegishi

(10) Patent No.: US 6,462,618 B2
(45) Date of Patent: Oct. 8, 2002

(54) AMPLIFYING CIRCUIT WITH DISTORTIONLESS OUTPUTS

(75) Inventor: Atsushi Minegishi, Tokyo (JP)

(73) Assignee: Iwatsu Electric Co., Ltd., Tokyo (JP)

(*) Notice: Subject to any disclaimer, the term of this patent is extended or adjusted under 35 U.S.C. 154(b) by 0 days.

(21) Appl. No.: 09/918,557

(22) Filed: Aug. 1, 2001

(65) Prior Publication Data

US 2002/0039049 A1 Apr. 4, 2002

(30) Foreign Application Priority Data

Sep. 29, 2000 (JP) ........................................ 2000-298465

(51) Int. Cl.$^7$ ................................................. H03F 3/45
(52) U.S. Cl. .......................... 330/252; 330/258; 330/259
(58) Field of Search ................................ 330/252, 258, 330/259

(56) References Cited

U.S. PATENT DOCUMENTS

| | | | | |
|---|---|---|---|---|
| 4,904,953 A | * | 2/1990 | McCormack | ............... 330/253 |
| 5,148,118 A | * | 9/1992 | Dobkin et al. | .............. 330/252 |
| 5,613,233 A | * | 3/1997 | Vagher | ....................... 330/258 |

FOREIGN PATENT DOCUMENTS

JP          402288504 A   * 11/1990

* cited by examiner

*Primary Examiner*—Patricia Nguyen
(74) *Attorney, Agent, or Firm*—Oblon, Spivak, McClelland, Maier & Neustadt, P.C.

(57) ABSTRACT

An amplifying circuit with a level-shift circuit is disclosed. An amplifying unit includes two stages of differential amplifiers cascadedly connected. A differential amplifier of the first stage has a pair of differential input terminals. The differential amplifier of the last stage has a pair of differential output terminals. A level-shift circuit constituted of a couple of level-shifters is connected to the output terminals. The level-shift circuit level-shifts the DC level of the differential output from the amplifying unit. The level-shift circuit has a pair of output terminals to deliver the level-shifted differential output. A DC-dummy dummies the DC operation of the differential amplifier of the last stage. The DC-dummy has the power supply in common with the differential amplifier of the last stage. A level-shifter shifts the output level from the DC-dummy and delivers the level-shifted dummy output. The constitution of the level-shifter is the same as one of a couple of level-shifters in the level-shift circuit. An operational amplifier keeps a voltage of the level-shifted dummy output constant. Therefore, the operational amplifier supplies the voltage power in common to the differential amplifier of the last stage and the DC-dummy.

6 Claims, 9 Drawing Sheets

Amplifying Circuit 160

Amplifying Unit 150L

Amplifying Unit 150M

Amplifying Circuit 160L (A)

(B)

Amplifying Circuit 160B

Amplifying Circuit 160C

AMPLIFYING CIRCUIT WITH DISTORTIONLESS OUTPUTS

BACKGROUND OF THE INVENTION

1. Field of the Invention

The present invention relates to an amplifying circuit.

The invention is particularly concerned with a circuit usable for a measuring instrument such as oscilloscopes.

In spite of large amplitude inputs applied or resistance irregularities of resistors employed therein, the amplifying circuit can deliver distortionless outputs.

Regardless of fluctuations of the environmental temperature or changes of voltages or currents of power supplies, the amplifying circuit can output distortionless waveforms.

2. Description of the Prior Art

In an oscilloscope, waveforms to be observed are large frequency bandwidth signals from DC to high frequency. In the current oscilloscope, it is required to observe signals of several hundred MHz to several GHz or high repetition rate pulses.

An amplifying circuit employed in such an oscilloscope is usually included in an integrated circuit. The integrated circuit satisfies requirements to observe of large bandwidth and high repetition rate signals.

The amplifying circuit being in the integrated circuit includes, generally, differential amplifiers. In order to amplify large bandwidth and high repetition rate signals, npn transistors having excellent high frequency characteristics are employed in the differential amplifier. Many stages of the differential amplifiers including npn transistors are connected in series so as to constitute the amplifying unit. In the amplifying unit, there is a problem that the output potential is shifted up to positive in potential by the connection in series.

Shown in FIG. 1 is a circuit diagram of a prior art amplifying unit. The unit is constituted of two stages of differential amplifiers cascadedly connected. In FIG. 1, elements 101 and 102 are npn transistors to form a common emitter differential amplifier 100. Elements 201 and 202 are npn transistors to form a common emitter differential amplifier 200L.

Elements 103 and 104 are negative feedback resistors in the differential amplifier 100. Each of feedback resistors 103 and 104 is connected in series between emitters of the transistors 101 and 102.

Elements 203 and 204 are negative feedback resistors in the differential amplifier 200L. Each of feedback resistors 203 and 204 is connected in series between emitters of the transistors 201 and 202.

Elements 105 and 106 are load resistors in the differential amplifier 100. Elements 205 and 206 are load resistors in the differential amplifier 200L. Elements 107 and 207 are constant current sources of differential amplifiers 100 and 200L.

The element 151 is a pair of differential input terminals of an amplifying unit 150L including two stages of differential amplifiers 100 and 200L. The element 152 is a pair of differential output terminals of the amplifying unit 150L.

In the differential amplifier 100, each of load resistors 105 and 106 is connected between a constant positive voltage source Vcc and each of collectors of transistors 101 and 102.

In the differential amplifier 200L, each of load resistors 205 and 206 is connected between a constant positive voltage source Vcc and each of collectors of transistors 201 and 202.

The constant current source 107 is connected between a center junction of two feedback resistors 103 and 104 connected in series and a constant negative voltage source $V_{EE}$. The constant current source 207 is connected between a center junction of two feedback resistors 203 and 204 connected in series and a constant negative voltage source $V_{EE}$.

The collector of the transistor 101 in the differential amplifier 100 is connected to a base of the transistor 202 in the differential amplifier 200L. The collector of the transistor 102 is connected to a base of the transistor 201 in the differential amplifier 200L.

In the amplifying unit 150L of FIG. 1, the relation between the input voltage Vicom and the output voltage Vocom can be shown as follows.

Vocom>Vicom

Therein, Vicom is a common-mode voltage applied to the input terminals 151 and Vocom is a common-mode voltage delivered from the output terminals 152.

In each of the differential input of the input terminals 151 and the differential output of the output terminals 152, a voltage change in common-mode is so called the common-mode voltage.

As already stated, the amplifying circuits in measuring instruments such as oscilloscopes amplify signals from DC to high frequency. In such a large bandwidth, it is desirable that the common-mode output voltage is 0V. It is, therefore, required that the common-mode output voltage Vocom is kept 0V or so.

In FIG. 2, there is shown a circuit diagram of another prior art amplifying unit. A differential amplifier 200M of the second stage in the amplifying unit 150M includes two pnp transistors 208 and 209. It is able to keep the same output voltage Vocom of the terminals 152 as the input voltage Vicom of the input terminals 151 in common-mode.

However, pnp transistors are, generally, inferior to npn transistors in high frequency characteristics. The amplifying unit 150M including pnp transistors 208 and 209 can not, therefore, obtain the same large bandwidth as that of npn transistors.

In the amplifying circuit used for measuring instruments like an oscilloscopes, a level-shift circuit is employed. The circuit shifts the DC level of the common-mode output voltage Vocom to 0V approximately. The circuit is connected to the output stage of an amplifying unit.

In FIG. 3, there is shown a circuit diagram of a prior art amplifying circuit with a level-shift circuit. The level-shift circuit 300 is appended to the amplifying unit 150L of FIG. 1. In FIG. 3, elements similar to those previously described with reference to FIG. 1 are denoted by the same reference numerals.

A pair of differential output terminals 162 is output terminals of the amplifying circuit 160L with the level-shift circuit. The level-shift circuit 300 is constituted of a couple of two level-shifters having the same composition. A level-shifter includes an npn transistor 301, a diode group 303 of n diodes connected in series and a constant current source 305. Another level-shifter includes an npn transistor 302, a diode group 304 of n diodes connected in series and a constant current source 306. Each of diode groups 303 and 304 containing one diode or more connected in series functions as a constant voltage diode.

A base of the transistor 301 is connected to the collector of the transistor 202 in the differential amplifier 200L. A base of the transistor 302 is connected to the collector of the transistor 201 in the differential amplifier 200L. Each of bases of transistors 301 and 302 is connected to the output terminals 152 of the differential amplifier 150L.

A collector of the transistor 301 is connected to a positive voltage source VCC. A collector of the transistor 302 is connected to a positive voltage source VCC.

An emitter of the transistor 301 is connected to an anode of the first diode in the diode group 303. An emitter of the transistor 302 is connected to an anode of the first diode in the diode group 304.

A cathode of the last diode in the diode group 303 is connected to one end of the constant current source 305. A cathode of the last diode in the diode group 304 is connected to one end of the constant current source 306. Another end of each of constant current sources 305 and 306 is connected to each of negative voltage sources $V_{EE}$s.

The output of the amplifying circuit 160L with a level-shift circuit 300 is delivered from each of cathodes of the last diodes in diode groups 303 and 304. The cathodes of the last diodes are connected to a pair of differential output terminals 162.

The base-emitter voltage of each of transistors 301 and 302 is Vbe. The anode-cathode voltage (forward-voltage) per one diode in diode groups 303 and 304 is Vf. A voltage shifted by the level-shift circuit 300 is representable as Vsft by the following equation.

$$Vsft = Vbe + n \times Vf$$

The desired number of n diodes is, therefore, settled in each of diode groups 303 and 304 so as to obtain the desired voltage Vsft to be shifted.

However, the amplifying circuit 160L with a level-shift circuit shown in FIG. 3 has following defects. Namely, the base-emitter voltage Vbe of each of transistors 301 and 302 changes by environmental temperature changes. Similarly, the forward-voltage Vf of each of diodes in diode groups 303 and 304 changes, too. The shifted voltage Vsft cannot be, therefore, kept constant.

For example, each of base-emitter voltage Vbe of transistors and forward-voltage Vf of diodes is 0.7V(Vbe=Vf= 0.7V). The number of n diodes in each of diode groups 303 and 304 is 5(n=5). In such a case, the shifted voltage Vsft is 4.2V from the above-mentioned equation.

Each of the base-emitter voltages Vbes and the forward-voltages Vfs changes according to temperature changes. Suppose the voltage Vbe and the voltage Vf change at −2 mV/° C. being typical value, the shifted voltage Vsft by a temperature change of 100° C. is 5.4V. The shifted voltage Vsft changes by 1.2V.

Moreover, the common-mode output voltage Vocom from the output terminals 162 may be changed by the voltage change of the positive voltage source Vcc or the current change of the constant current source 207.

It is desired that the common-mode output voltage Vocom of the output terminals 162 is fixed to 0V approximately. For the purpose, it is required to prevent from influences by temperature changes and voltage changes or current changes of power supplies.

In FIG. 4, there is shown a circuit diagram of another prior art amplifying circuit 160M with the level-shift circuit 300M. In FIG. 4, elements similar to those previously described with reference to FIG. 3 are denoted by the same reference numerals. The followings are different points from the constitution of the amplifying circuit with the level-shift circuit 300 shown in FIG. 3.

In the level-shift circuit 300M, two resistors 307 and 308 are connected in series between cathodes of the last diodes in each of diode groups 303 and 304. Resistors 307 and 308 have the equal resistance. The resistance is 1 or several kΩ and is enough higher than that of a load resistor to be connected between output terminals 162. Each of resistors 307 and 308, of which resistance is enough higher than that of the load resistor, effects as no load resistor.

A center junction 309 of the resistors 307 and 308 is connected to a negative input terminal of an operational amplifier 30. A positive input terminal of the operational amplifier 30 is grounded. An output of the operational amplifier 30 is connected to a common junction 210 of the load resistors 205 and 206 in the differential amplifier 200 of the second stage.

According to the circuit 160M, the average voltage of the output from the output terminals 162, i.e., the common-mode output voltage Vocom appears at the common junction 309 of two resistors 307 and 308. The common-mode output voltage Vocom is varied by the base-emitter voltage Vbe of each of transistors 301 and 302 influenced with temperature changes. The common-mode output voltage Vocom can be changed by the forward-voltage Vf of each of diodes in diode groups 303 and 304, as the forward-voltage Vf is effected by temperature changes, too.

The common-mode output voltage Vocom is applied to the negative input terminal of the operational amplifier 30. The output of the operational amplifier 30 is negatively feedback to the common junction 210 of the load resistors 205 and 206. The common-mode output voltage Vocom can be, therefore, kept at the ground voltage of 0V. The ground voltage is caused by the grounded positive input terminal voltage of the operational amplifier 30.

Therefore, according to the amplifying circuit 160M with a level-shift circuit shown in FIG. 4, the common-mode output voltage Vocom from the output terminals 162 can be stabilized. Even if the shifted voltage Vsft of the level-shift circuit 300M is influenced with temperature changes, the common-mode output voltage Vocom can be stabilized.

However, there is a problem to be solved in the amplifying circuit 160M with the level-shift circuit. When being applied with a large amplified input signal, the differential amplifier 200 is saturated. In the output from the output terminals 162, the output signal waveform is, thereby, distorted.

In FIG. 5, there are shown operations of the amplifying circuit 160M with the level-shift circuit. When a large amplified pulse is applied at the input terminals 151, the differential amplifier 100 and 200 are saturated.

Each of waveforms 401 and 402 shown in FIG. 5(A) is obtained from each of the output terminals 162 when the feedback control of the operational amplifier 30 is not employed. Each of waveforms 403 and 404 shown in FIG. 5(B) is obtained from each of the output terminals 162 when the operational amplifier 30 is employed as shown in FIG. 4.

In FIG. 5(A), the common-mode output voltage Vocom is shifted. The common-mode output voltage Vocom is nearly 1.5V. However, the waveform 401 in positive direction and the waveform 402 in negative direction are equal in amplitude. The unbalance between the waveforms is at a minimum.

On the other side, in FIG. 5(B), the common-mode output voltage Vocom is not almost shifted. Namely, the common-mode output voltage Vocom is nearly 0V. However, the waveform 403 in positive direction and the waveform 404 in negative direction are not equal in amplitude. The waveforms 403 and 404 are unbalanced. Because, the distortions have been caused on each of waveforms 403 and 404 obtained at the output terminals 162.

The waveform distortions in the circuit of FIG. 4 are based on the following reasons. When differential amplifiers 100 and 200 are saturated, the unbalance is caused in the amplitudes of positive and negative directions at the output terminals 162. Therefore, the voltage at the center junction 309 of two resistors 307 and 308 is not equal to the common-mode output voltage Vocom. The signal applied to the negative input terminal of the operational amplifier 30 is inconstant as shown by the dotted line 405 of FIG. 5(B). Consequently, in the range of the response time of the operational amplifier 30, the voltage of the common junction 210 of two load resistors 205 and 206 is varied and it causes the waveform distortions.

The larger the open-loop gain of the operational amplifier 30 is, the more remarkable the phenomena become. For example, in an oscilloscope, the observation of waveforms may be impossible during several micro seconds after a large amplitude input signal being applied to the input terminals 151 of the amplifying circuit 160M.

In an oscilloscope, for observing rising and falling portions of a pulse, the pulse amplitude may be amplified enough. Moreover, for observing a waveform near 0V in detail, the amplitude of the pulse may be magnified enough and displayed. In such a case, differential amplifiers 100 and 200 are saturated.

In an oscilloscope employing the amplifier such as the amplifying circuit 160M with a level-shift circuit, it is required to take countermeasure against waveform distortions as much as possible so as to observe distortionless waveforms. In spite of excessive input by which differential amplifiers 100 and 200 are saturated, it is important to be able to display distortionless waveforms. Especially, in the current wide band oscilloscope, waveforms may be sometimes observed in a range of a few nano seconds. In the case, there is a serious problem that it is impossible to observe waveform during several micro seconds after an excessive input applied to differential amplifiers 100 and 200. It is important to enable the oscilloscope to display waveforms as quickly as possible after the excessive input.

Besides, waveform distortions of the output from the amplifying circuit 160M with the level-shift circuit may be caused by the irregularity of resistances of load resistors 205 and 206. Waveform distortions are also caused by the irregularity of resistors 307 and 308. In spite of differential amplifiers 100 and 200 being not saturated, waveform distortions of the output are effected by those irregular resistances.

The output from the amplifying circuit 160M shown in FIG. 4 is not theoretically influenced with temperature changes or voltage or current changes of power supplies. The common-mode output voltage Vocom from the output terminals 162 can be kept constant. However, differential amplifiers 100 and 200 may be, actually, saturated by the excessive input. The irregularity of resistances may happen in load resistors 205 and 206 or resistors 307 and 308. In such a case, the amplifying circuit 160M shown in FIG. 4 has the defects that waveform distortions of the output are effected.

SUMMARY OF THE INVENTION

An object of the invention is to provide a new amplifying circuit with a level-shift circuit without waveform distortions even if differential amplifiers employed therein are saturated.

Another object of the invention is to provide a novel and highly precise amplifying circuit with a level-shift circuit without waveform distortions at the output even if resistors used in the differential amplifiers have irregular resistances.

A further object of the invention is to provide a new and highly precise amplifying circuit with a level-shift circuit without waveform distortions at the output in spite of temperature changes or voltage and current changes of power supplies.

A further object of the invention is to provide a novel amplifying circuit with a level-shift circuit which is suitable for constituting monolithic integrated circuits.

In the amplifying circuit with a level-shift circuit according to the invention, the amplifying circuit includes an amplifying unit, a level-shift circuit, a DC-dummy, a level-shifter and an operational amplifier.

An amplifying unit includes at least one differential amplifier cascadedly connected. A differential amplifier of the first stage has a pair of input terminals to which a pair of differential input signals is applied. A differential amplifier of the last stage has a pair of differential output terminals to obtain the differential output.

A level-shift circuit is consisted of a couple of level-shifters. The level-shift circuit is connected to the pair of differential output terminals of the differential amplifier of the last stage in the amplifying unit. The level-shift circuit shifts the DC level of the differential output from the amplifying unit and delivers the shifted differential output.

A DC-dummy operates as a dummy of the DC operation of the differential amplifier of the last stage in the amplifying unit. Therefore, the DC-dummy has the power supply in common with the differential amplifier of the last stage.

The level-shifter shifts a level of the output of the DC-dummy to obtain the dummy output level-shifted. The constitution of the level-shifter is similar to one of a couple of level-shifters in the level-shift circuit.

The negative input terminal of the operational amplifier is maintained at grounded voltage or a fixed voltage. Therefore, the operational amplifier controls so as to supply the power to the differential amplifier of the last stage in the amplifying unit and the DC-dummy in common.

According to the above composition, the shifted voltage of the level-shifter equals to that of the level-shift circuit. Then the operational amplifier controls so as to supply the power. The output voltage of the level-shifter is, therefore, kept constant. Consequently, the common-mode output voltage Vocom delivered from the level-shift circuit is kept constant.

Furthermore, even if the differential amplifiers in the amplifying unit is saturated by an excessive input, only the DC voltage appears in the DC-dummy and the level-shifter. A stable feedback operation is obtainable so as to keep the Vocom constant. Therefore, no waveform distortion is caused in the output of the amplifying circuit with the level-shift circuit.

The advantages of the present invention will be apparent from the following detailed description of preferred embodiments thereof that proceed with reference to the accompanying drawings.

BRIEF DESCRIPTION OF THE DRAWINGS

The principle construction and operation of the present invention will be clearly understood from following detailed description taken in conjunction with the accompanying drawings. in which.

DESCRIPTION OF THE PREFERRED EMBODIMENTS

The present invention will be described herein under in detail with reference to the accompanying drawings.

Figure 1:
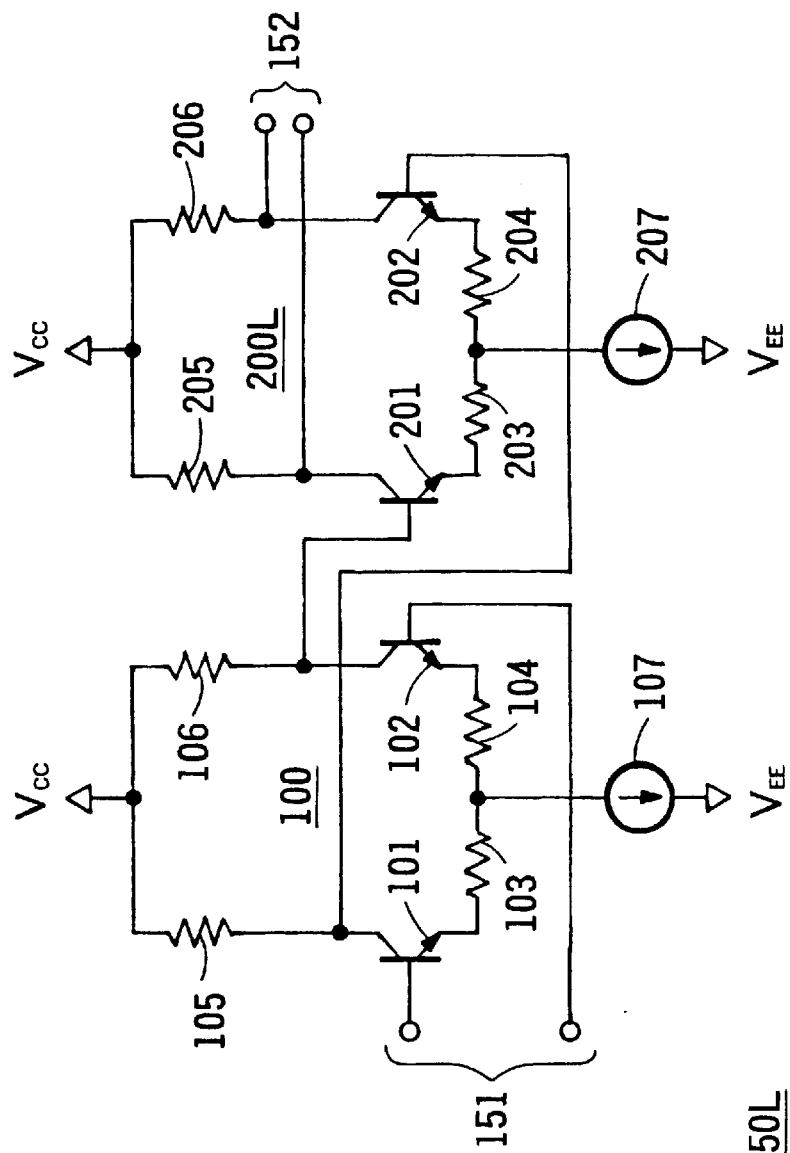
FIG. 1 is a circuit diagram of an amplifying unit in which differential amplifiers are cascadedly connected in accordance with the prior art.
Figure 2:
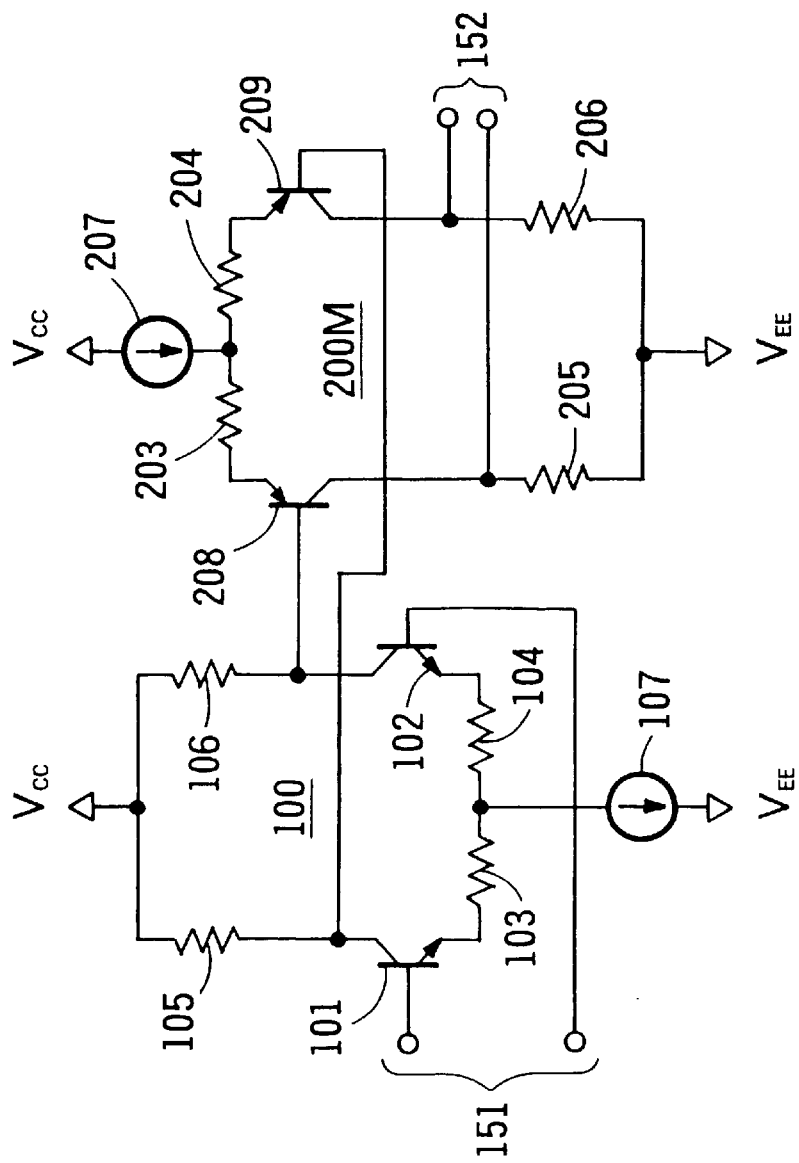
FIG. 2 is a circuit diagram of another amplifying unit in which differential amplifiers are cascadedly connected in accordance with the prior art.
Figure 3:
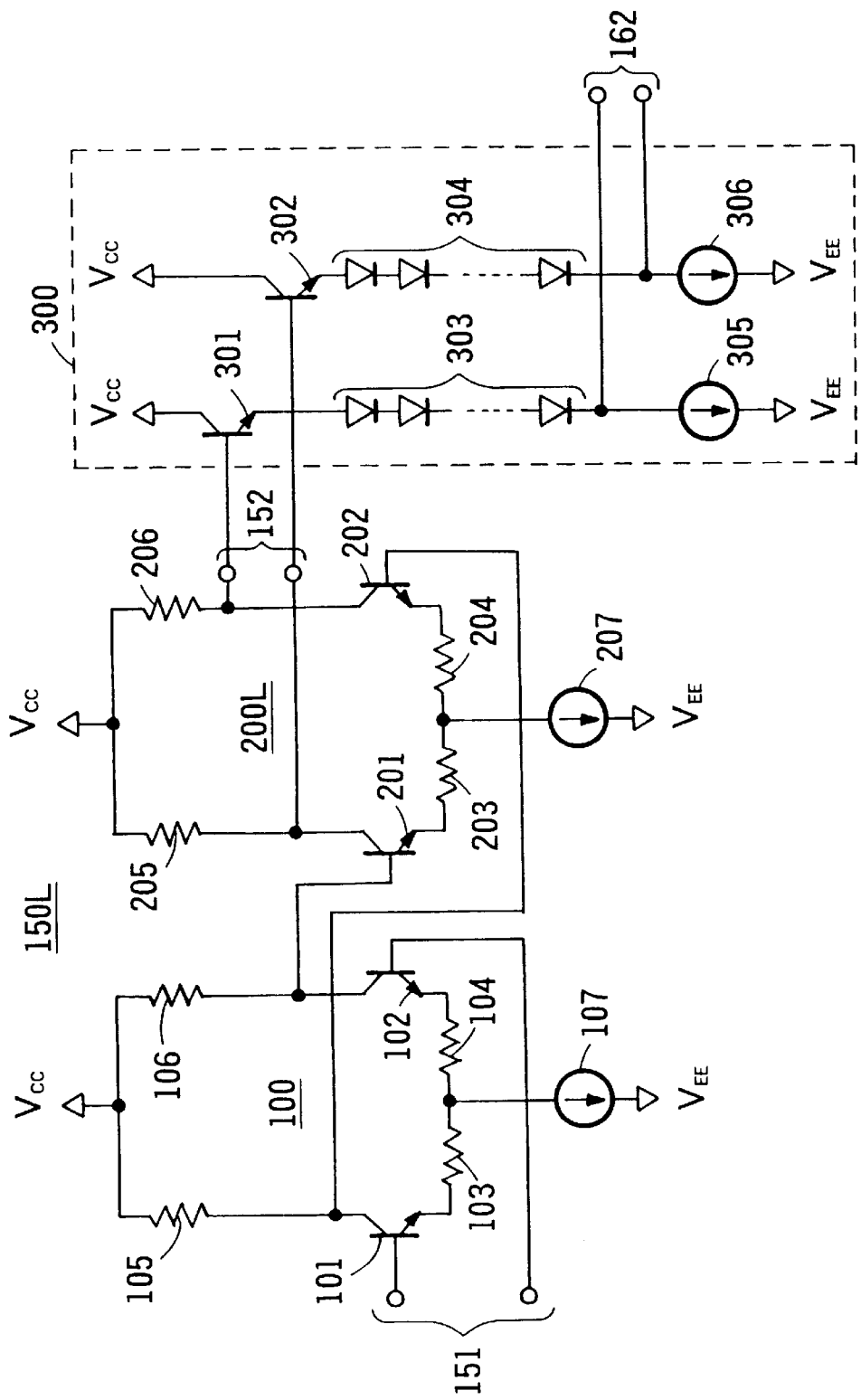
FIG. 3 is a circuit diagram of an amplifying circuit with a level-shift circuit in accordance with the prior art.
Figure 4:
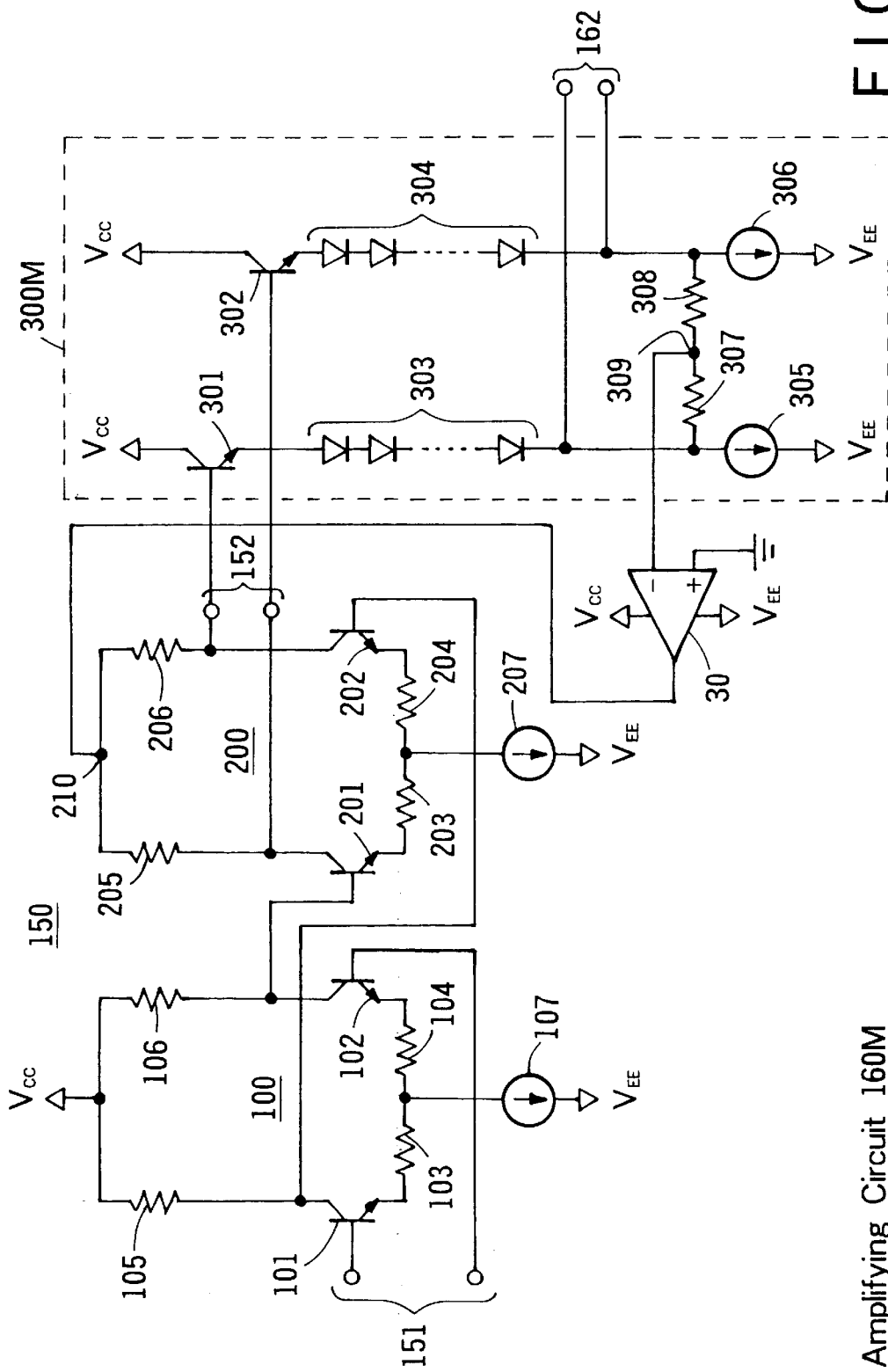
FIG. 4 is a circuit diagram of another amplifying unit with a level-shift circuit in accordance with the prior art.
Figure 5:
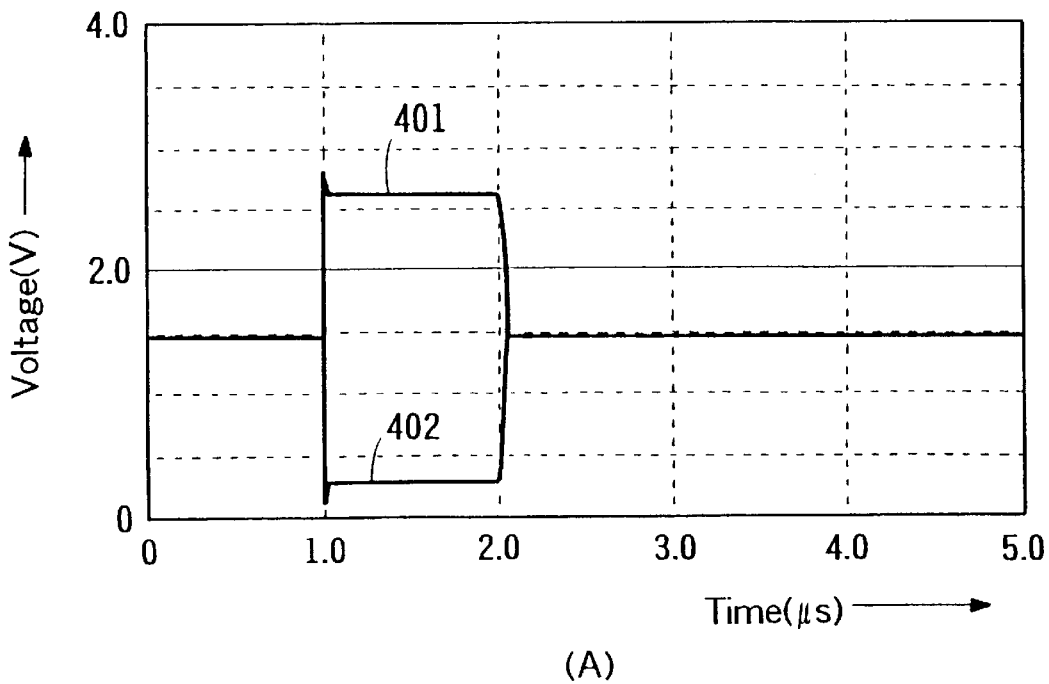
FIG. 5 is a simulated waveform diagram showing an operation of the amplifying circuit with a level-shift circuit of FIG. 4.
Figure 5:
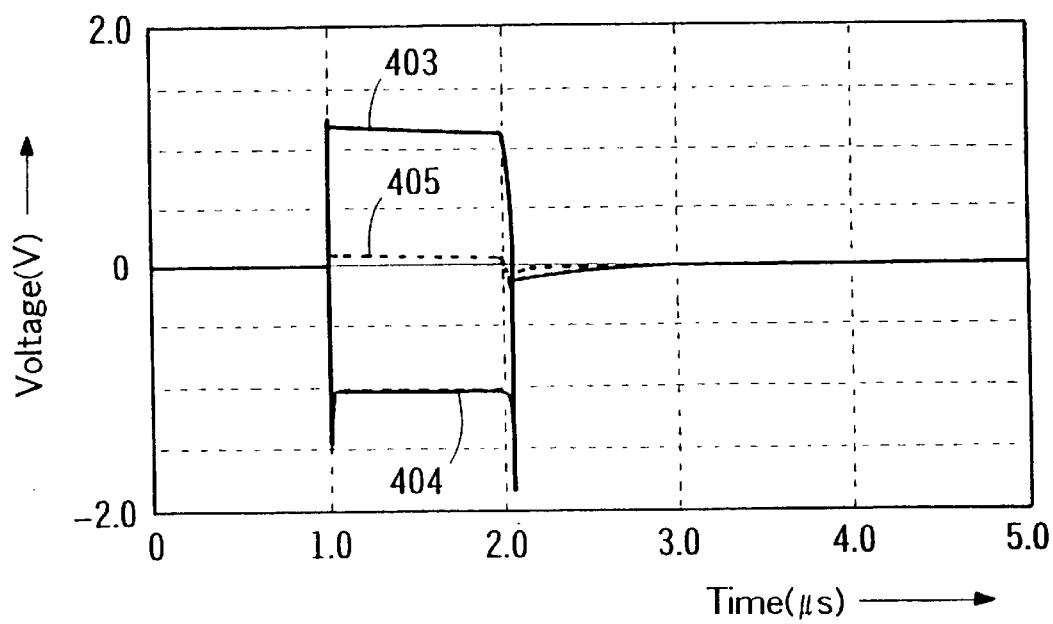
Figure 6:
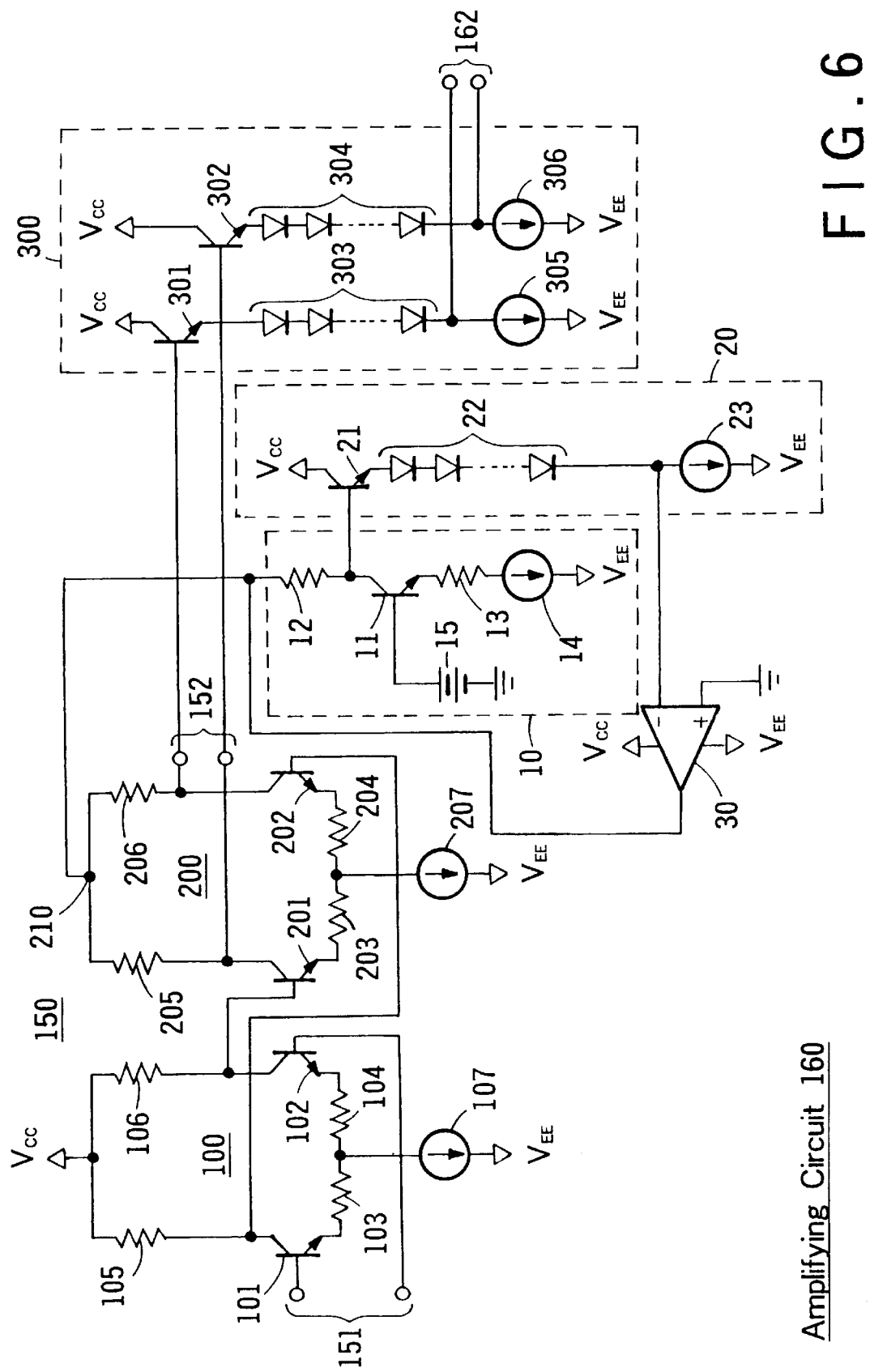
FIG. 6 is a circuit diagram of the first embodiment of an amplifying circuit with a level-shift circuit in accordance with the present invention.

FIG. 6 shows the first embodiment of an amplifying circuit with a level-shift circuit in accordance with the present invention. In FIG. 6, elements similar to those previously described with reference to FIG. 3 and FIG. 4 are denoted by the same reference numerals.

In the amplifying circuit 160 with the level-shift circuit of FIG. 6, a common-mode output voltage Vocom from output terminals 162 is set to 0V. Two differential amplifiers 100 and 200 are cascadedly connected in like manner with the amplifying circuit 160M of FIG. 4.

The amplifying unit 150 has differential input terminals 151 and differential output terminals 152. Elements 101 and 102 are npn transistors which constitute the common emitter differential amplifier 100. Elements 201 and 202 are npn transistors which constitute the common emitter differential amplifier 200.

Elements 103 and 104 are negative feedback resistors of the differential amplifier 100. The feedback resistors 103 and 104 are connected in series between emitters of the transistors 101 and 102.

Elements 203 and 204 are negative feedback resistors of the differential amplifier 200. The feedback resistors 203 and 204 are connected in series between emitters of the transistors 201 and 202.

Elements 105 and 106 are load resistors of the differential amplifier 100. Elements 205 and 206 are load resistors of the differential amplifier 200. Elements 107 and 207 are constant current sources of differential amplifiers 100 and 200.

In the differential amplifier 100, each of load resistors 105 and 106 is connected between a positive voltage source Vcc and a collector of each of transistors 101 and 102. The constant current source 107 is connected between a center junction of two feedback resistors 103 and 104 and a negative voltage source $V_{EE}$.

In the differential amplifier 200, one end of each of load resistors 205 and 206 is connected to a collector of each of transistors 201 and 202, and another end is connected to a common junction 210. The common junction 210 of the load resistors 205 and 206 is connected to an output terminal of an operational amplifier 30. The constant current source 207 is connected between a center junction of two feedback resistors 203 and 204 and a negative voltage source $V_{EE}$.

At the input terminals 151 a differential input is applied to between bases of transistors 101 and 102 in the differential amplifier 100. Each of collectors of transistors 101 and 102 is connected to each of bases of transistors 201 and 202 in the differential amplifier 200.

The level-shift circuit 300 is arranged between the output terminals 152 of the amplifying unit 150 and output terminals 162 of the amplifying circuit 160.

The level-shift circuit 300 is constituted of a couple of level-shifters. One level-shifter is constituted of an npn transistor 301, a diode group 303 containing n diodes connected in series and a constant current source 305. Another level-shifter is also constituted of an npn transistor 302, a diode group 304 containing n diodes connected in series and a constant current source 306. Each of diode groups 303 and 304 has function of a constant voltage diode.

A base of the transistor 301 is connected to the collector of the transistor 202 of the differential amplifier 200. A base of the transistor 302 is connected to the collector of the transistor 201 of the differential amplifier 200.

A collector of the transistor 301 is connected to a positive voltage source VCC. A collector of the transistor 302 is connected to a positive voltage source VCC.

An emitter of the transistor 301 is connected to an anode of the first diode in the diode group 303. An emitter of the transistor 302 is connected to an anode of the first diode in the diode group 304.

A cathode of the last diode in diode group 303 is connected to a constant current source 305. A cathode of the last diode in the diode group 304 is connected to a constant current source 306. Each of constant current sources is connected to each of negative voltage sources $V_{EE}$s.

The output terminals 162 of the amplifying circuit 160 with the level-shift circuit are connected to cathodes of the last diode of diode groups 303 and 304. The desired number of n diodes is settled in each of diode groups 303 and 304 so as to obtain the desired voltage Vsft to be shifted.

The DC-dummy 10 operates as a dummy of the DC operation of the differential amplifier 200 of the last stage in the amplifying unit 150. The DC-dummy 10 delivers the DC voltage equal to a common-mode output voltage Vocom from the differential amplifier 200.

In the latter stage of many stages of differential amplifiers cascadedly connected, there is almost no influence of preceding stage of differential amplifiers because of CMMR (Common Mode Rejection Ratio). Therefore, it is effective enough to arrange the DC-dummy which dummies the DC operation of the differential amplifier 200 of the last stage.

The DC-dummy 10 is constituted of an npn transistor 11, a load resistor 12, a feedback resistor 13, a constant current source 14 and a reference voltage source 15. The reference voltage source 15 functions as a reference potential.

A collector of the transistor 11 in the DC-dummy 10 is connected to a level-shifter 20. The constitution of the level-shifter 20 is similar to that of one of a couple of level-shifters in the level-shift circuit 300.

Moreover, the collector of the transistor 11 is connected to the common junction 210 of two load resistors 205 and 206 of the differential amplifier 200 via the load resistor 12. The load resistors 205 and 206 have the same resistance.

An emitter of the transistor 11 is connected to the constant current source 14 via the feedback resistor 13. The constant current source 14 is connected to a negative voltage source $V_{EE}$.

The reference voltage source 15 applies the reference potential to the base of the transistor 11. The reference voltage of the source 15 is substantially equal to the base potential of the transistor 201 or 202 of the differential amplifier 200 of the last stage.

As already stated, the DC-dummy 10 dummies the DC operation of the differential amplifier 200.

At first it is described that the size of the transistor 11 in the DC-dummy 10 equals to each of the sizes of transistors 201 and 202 in the differential amplifier 200 on an integrated circuit pattern. In this case, temperature characteristics of the transistor 11 of the DC-dummy 10 are equal to that of each of transistors 201 and 202. Therefore, the accurate dummy output is obtainable from the DC-dummy 10. The current of the transistor 11 equals to that of each of transistors 201 and 202.

Resistance of the load resistor 12 in the DC-dummy 10 is equal to the resistance of each of resistors 205 and 206. Similarly, the resistance of the feedback resistor 13 in the DC-dummy 10 is equal to the resistance of each of feedback resistors 203 and 204 in the differential amplifier 200.

In such a case, the collector current value of the transistor 11 is equal to that of each of transistors 201 or 202. The current value of the constant current source 207 is equal to the total collector currents of transistors 201 and 202.

The current value of the constant current source 14 in the DC-dummy 10 is half the constant current source 207 in the differential amplifier 200. Therefore, the common-mode output voltage from the output terminals 152 of the amplifying unit 150 is equal to the output of the DC-dummy 10, which is the collector voltage of the transistor 11, provided that the differential amplifier 200 is not saturated or not cut off.

In the first embodiment, the reference voltage applied to the base of the transistor 11 is fixed to the constant value. No signal is applied to the base of the transistor 11. When no signal is added to the base of the transistor 11, it is not necessary to employ a differential input arrangement. The collector current of the transistor 11 of FIG. 6 is equal to a half of that of the differential amplifier 200.

The level-shifter 20 shifts the level of the output of the DC-dummy 10. The constitution of the level-shifter 20 is similar to one of a couple of level-shifters in the level-shift circuit 300. The DC-dummy 10 includes a transistor 11, a load resistor 12, a feedback resistor 13 and a constant current source 14. Accordingly, the level-shifter 20 is the same circuit as one of a couple of level-shifters in the level-shift circuit 300.

Namely, the level-shifter 20 includes an npn transistor 21, a diode group 22 containing n diodes connected in series and a constant current source 23. A base of the transistor 21 is connected to the collector of the transistor 11 which is the output of the DC-dummy 10.

The level-shifter 20 has the same function as that of one of two level-shifters in the level-shift circuit 300. Therefore, the transistor 21 has the same size as each of transistors 301 and 302 on the integrated circuit pattern. The size and the number of diodes in diode group 22 are equal to those of each of diode groups 305 and 304. Further, the constant current source 23 has the same current value as that of each of the constant current sources 305 and 306.

The base-emitter voltage Vbe of the transistor 21 in the level-shifter 20 is, therefore, equal to that of each of transistors 301 and 302 in the level-shift circuit 300. The forward-voltage Vf of each of diodes of the diode group 22 in the level-shifter 20 is equal to that of each of diodes of diode groups 303 and 304 in the level-shift circuit 300.

The level-shifter 20 is arranged near to the level-shift circuit 300 on the integrated circuit pattern. The forward-voltage Vf of each of the diodes has the same temperature characteristics as those of the base-emitter voltage Vbe.

A cathode of the last diode of the diode group 22 in the level-shifter 20 is connected to the negative input terminal of the operational amplifier 30. The positive input terminal of the operational amplifier 30 is grounded. The output of the operational amplifier 30 is negatively fedback to the common junction 210 of two load resistors 205 and 206 in the differential amplifier 200. Moreover, the output terminal of the operational amplifier 30 is connected to one end of the load resistor 12 in the DC-dummy 10.

The operation of the amplifying circuit 160 with a level-shifter will be described as follows.

In the differential amplifier 200 of the amplifying unit 150, the voltage at each of collectors of transistors 201 and 202 is not level-shifted. The voltage not level-shifted is removed by the level-shift circuit 300 so as to obtain substantially 0V. The level-shifting operation is, therefore, executed.

Now, the output level-shifted from the level-shifter 20 applies to the negative input terminal of the operational amplifier 30. The operational amplifier 30 supplies the voltage power supply to the DC-dummy 10 and the differential amplifier 200 by the feedback control. Namely, the operational amplifier 30 can negatively feedback as the voltage power supply so that the voltage of the negative input of the operational amplifier 30 is set to 0V. The cathode of the last diode in the diode group 22 is set to 0V, too. The voltage, which corresponds to the common-mode output voltage Vocom delivered from the output terminals 162 of the level-shift circuit 300, appears at the cathode of the last diode.

The voltage power supply fedback by the operational amplifier 30 is also given to the differential amplifier 200. The common-mode output voltage Vocom from the output terminals 162 of the level-shift circuit 300 is, therefore, kept constant.

The base-emitter voltage Vbe of each of transistors 301 and 302 in the level-shift circuit 300 has the temperature characteristics. The forward-voltage Vf of each of the diodes in diode groups 303 and 304 also has the temperature characteristics. Nevertheless, the common-mode output voltage Vocom from the output terminals 162 of the level-shift circuit 300 is kept constant.

Let's suppose that an input voltage of the input terminals 151 in the amplifying unit 150 is 0V. The operational amplifier 30 executes the feedback control so as to supply the voltage power to the differential amplifier 200 and the DC-dummy 10. It is the feedback control so that the voltage of the negative input terminal in the operational amplifier 30 is set to 0V. Consequently, the common-mode output voltage Vocom from the output terminals 162 of the level-shift circuit 300 is set to 0V.

In the embodiment shown in FIG. 6, the operational amplifier 30 controls the DC ingredient even if an excessive amplitude signals, with which the differential amplifier 200 is saturated, is applied to the input terminals 151. No other signal than the DC ingredient is applied to the operational amplifier 30.

Moreover, even if each of load resistors 205 and 206 of which resistance is irregular, the operational amplifier 30 controls the DC ingredient. The voltage of the common junction 210 of two load resistors 205 and 206 in the differential amplifier 200 is, therefore, maintained at the voltage so that the voltage of the negative input terminal in the operational amplifier 30 is set to 0V.

Accordingly, a distortionless amplifying circuit with a level-shift circuit can be provided by a simple constitution even if an excessive input is applied or the resistances of load resistors are irregular.

Further, the voltage from the cathode of the last diode in the diode group 22 is applied to the negative input terminal of the operational amplifier 30. It is not necessary that each of resistors 307 and 308 to take out the common-mode output voltage Vocom is arranged as shown in FIG. 4.

Therefore, the distortionless output is obtainable as no influence the resistances of resistors 307 and 308 being irregular.

In the above-mentioned, the size $S_{11}$ of the transistor 11 in the integrated DC-dummy 10 is equal to each of the sizes $S_{201}$ and $S_{202}$ of transistors 201 and 202 in the differential amplifier 200 on the integrated pattern.

In such a case, the resistance $R_{12}$ of the load resistor 12 in the DC-dummy 10 is equal to each of the resistances $R_{205}$ and $R_{206}$ of load resistors 205 and 206 in the differential amplifier 200. The collector current value of the transistor 11 in the DC-dummy 10 is equal to the collector current value of each of transistors 201 and 202. The current value of the constant current source 207 is twice the collector current value of each of transistors 201 and 202. Therefore, the current value $I_{14}$ of the constant current source 14 in the DC-dummy 10 is half the current value $I_{207}$ of the constant current source 207 in the differential amplifier 200.

In case of the size $S_{11}$ is the double size of $S_{201}$ or $S_{202}$ on the integrated pattern, the resistance $R_{12}$ is half the resistance $R_{205}$ or $R_{206}$, and the current value $I_{14}$ is equal to the current value $I_{207}$.

Supposing the size $S_{11}$ is half the size of $S_{205}$ or $S_{206}$ on the integrated pattern, the resistance $R_{12}$ is the double resistance of $R_{205}$ or $R_{206}$, and the current value $I_{14}$ is equal to a quarter of the current value $I_{207}$. Then, the power dissipation of the whole circuit is a little.

Figure 7:
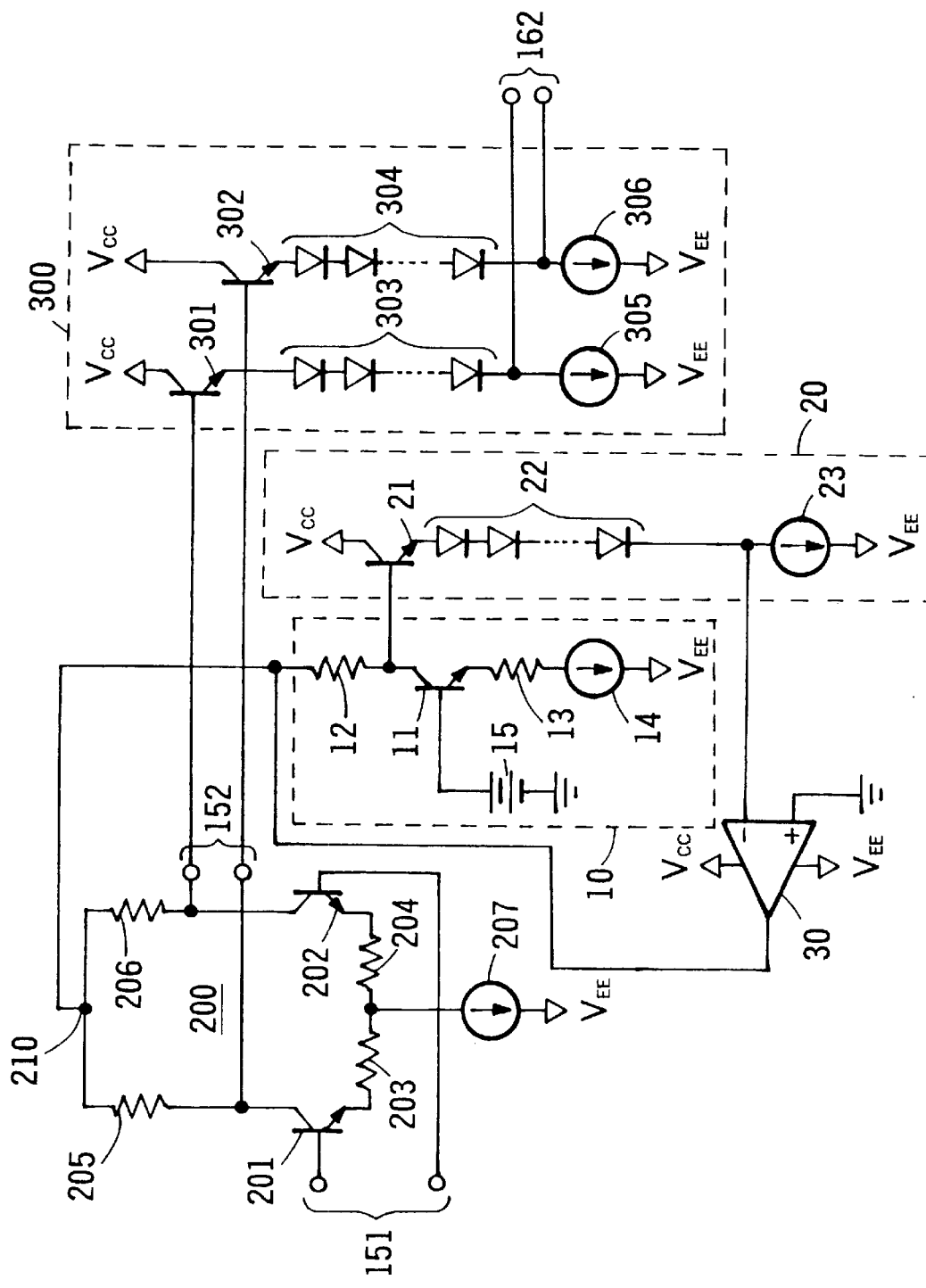
FIG. 7 is a circuit diagram of the second embodiment of an amplifying circuit with a level-shift circuit in accordance with the present invention.

FIG. 7 shows the second embodiment of an amplifying circuit with the level-sift circuit in accordance with the present invention. In FIG. 7, elements similar to those previously described with reference to FIG. 6 are denoted by the same reference numerals.

In the amplifying circuit 160B with the level-shift circuit, the single differential amplifier 200 is arranged. Other constitution is the same as the amplifying circuit 160 with the level-shift circuit of FIG. 6. Operations of the DC-dummy 10, the level-shifter 20 and the operational amplifier 30 are the same as those of the amplifying circuit 160 shown in FIG. 6.

In employing the single differential amplifier 200, the common-mode output voltage Vocom is kept constant, too.

Figure 8:
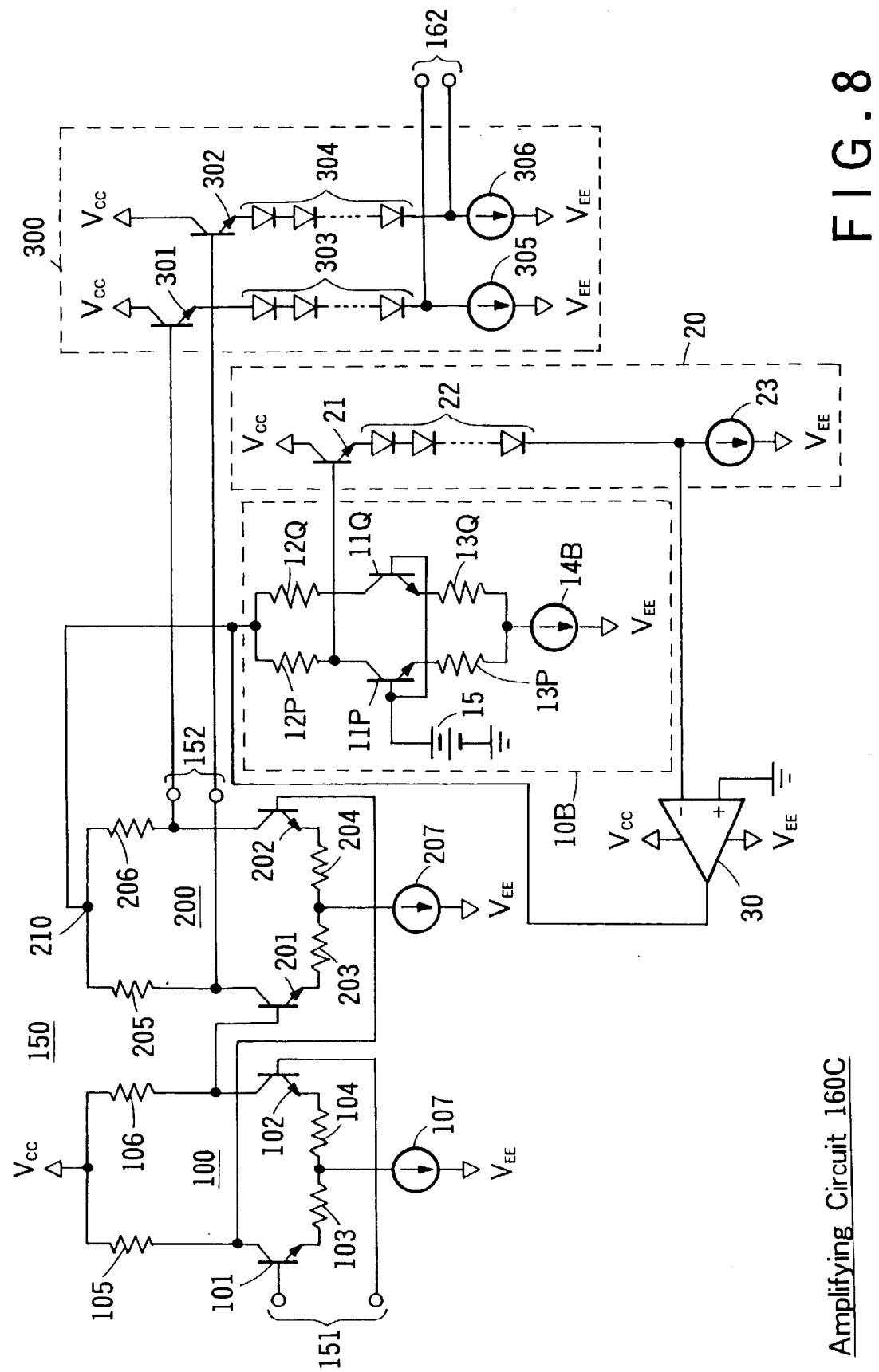
FIG. 8 is a circuit diagram of the third embodiment of an amplifying circuit with a level-shift circuit in accordance with the present invention.

In FIG. 8, the third embodiment of an amplifying circuit with the level-shift circuit is shown. In FIG. 8, elements similar to those previously described with reference to FIG. 6 are denoted by the same reference numerals. The portions different from those of FIG. 6 will be described.

In the amplifying circuit 160C with the level-shift circuit, different portions from the constitution of the amplifying circuit 160 of FIG. 6 are in the DC-dummy 10B. Others are the same constitutions as the amplifying circuit 160 of FIG. 6.

In the embodiment shown in FIG. 8, the circuit of the DC-dummy 10B is similar to that of the differential amplifier 200. Two transistors 11P and 11Q, two load resistors 12P and 12Q and two feedback resistors 13P and 13Q are employed in the DC-dummy 10B.

The DC-dummy 10B can precisely dummy the DC operation of the differential amplifier 200. The precise dummy output is obtained from the DC-dummy 10B.

Therefore, the common-mode output voltage Vocom from the output terminals 162 of the amplifying circuit 160C is precisely kept constant.

On the integrated circuit pattern, each of the sizes of transistors 11P and 11Q in the DC-dummy 10B is equal to each of the sizes of transistors 201 and 202 in the differential amplifier 200. Each of resistances of load resistors 12P and 12Q is equal to each of resistances of load resistors 205 and 206. Each of resistances of feedback resistors 13P and 13Q is equal to each of resistances of feedback resistors 203 and 204. The current value of the constant current source 14B is equal to that of the constant current source 207.

In the embodiment of FIG. 7, the DC-dummy 10B of FIG. 8 may be used instead of the DC-dummy 10 shown in FIG. 7.

Figure 9:
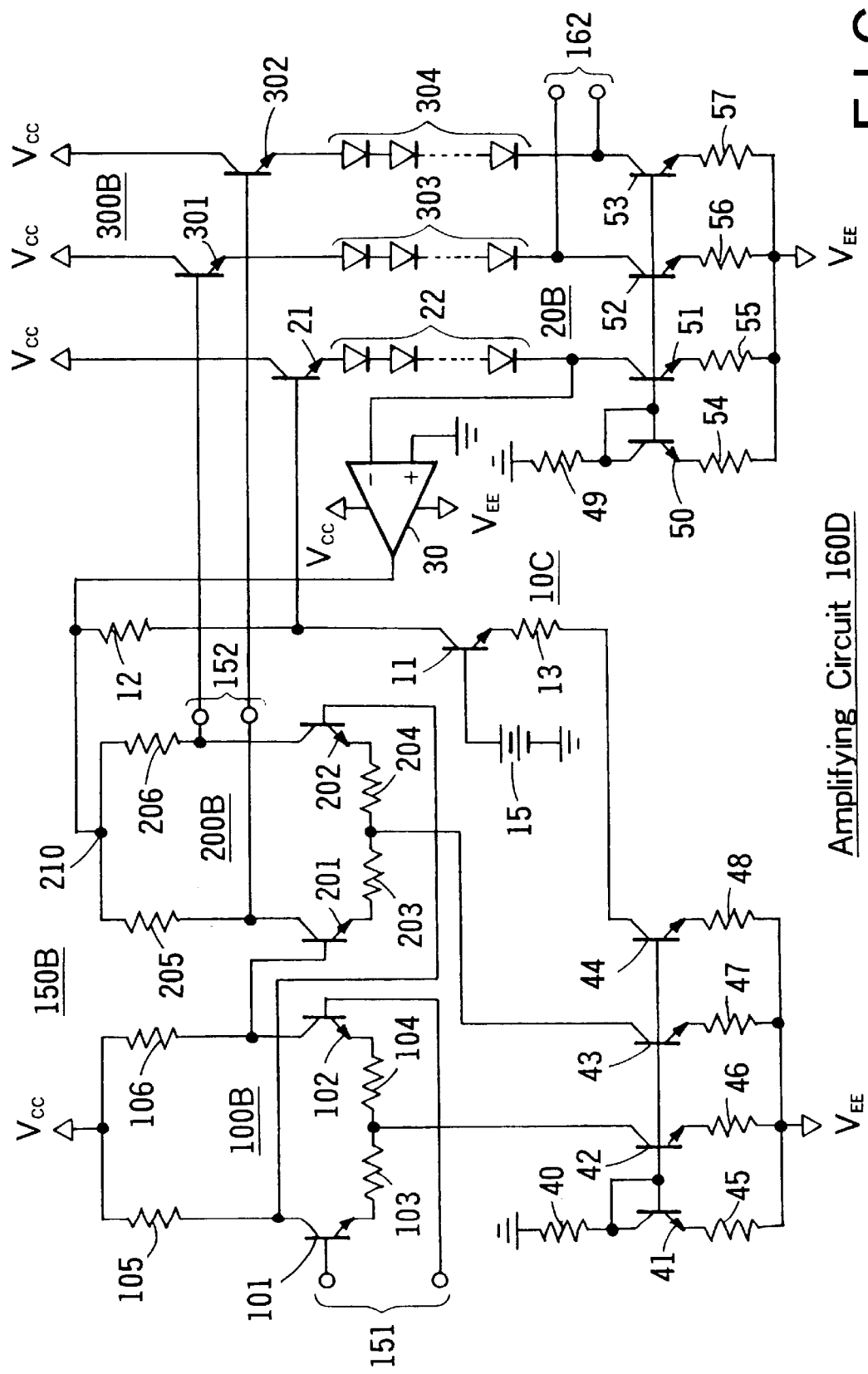
FIG. 9 is a detailed circuit diagram of the amplifying circuit with a level-shift circuit of FIG. 6.

FIG. 9 shows more embodied amplifying circuit with the level-shift circuit of FIG. 6 which is integrated. In FIG. 9, elements similar to those previously described with reference to FIG. 6 are denoted by the same reference numerals.

Elements 40, from 45 to 49 and from 54 to 57 are resistors. From 41 to 44 and from 50 to 53 are npn transistors. Four transistors 41 to 44 and five resistors 40 and 45 to 48 constitute a current-mirror circuit.

The transistor 42 and the resistor 46 constitute a constant current source of a differential amplifier 100B. The transistor 43 and the resistor 47 constitute a constant current source of a differential amplifier 200B. The transistor 44 and the resistor 48 constitute a constant current source of a DC-dummy 10C.

Four transistors 50 to 53 and five resistors 49 and 54 to 57 constitute another current-mirror circuit. The transistor 51 and the resistor 55 constitute a constant current source of a level-shifter 20B.

A level-shift circuit 300B includes two level-shifters. The transistor 52 and the resistor 56 constitute a constant current source of one of two level-shifters. The transistor 53 and the resistor 57 constitute a constant current source of another level-shifter.

Operations of the current-mirror will be described. In order to simplify the following description, it is supposed that the current amplification factor $H_{fe}$ of each of transistors 41 to 44 and 50 to 53 is infinite.

The current-mirror constituted of four transistors 41 to 44 is described as an example. The resistances of the resistors 40 and 45 are $R_{40}$ and $R_{45}$. The base-emitter voltage of each of transistors 41 to 44 is Vbe. The collector current $I_C$ of the transistor 41 is representable using following equation.

$I_C=(V_{EE}-Vbe)/(R_{40}+R_{45})$

Each of bases of transistors 41 to 44 is kept in the common potential. Now, each of sizes of transistors 41 to 44 is equal. Each of resistance of resistors 45 to 48 is equal. In such a case, each of voltages applied to resistors 45 to 48 is equal. Consequently, each of the collector currents $I_C$ of transistors 41 to 44 is equal according to the equation.

The current-mirror circuit constituted of four transistors 50 to 53 can be operate in like manner.

However, in FIG. 9, the size of the transistor 11 in the DC-dummy 10C is equal to each of sizes of transistors 201 and 202 in the differential amplifier 200B on the integrated circuit pattern. The resistance of the load resistor 12 in the DC-dummy 10C is equal to each of resistances of load resistors 205 and 206 in the differential amplifier 200B. The resistance of the feedback resistor 13 in the DC-dummy 10C is equal to each of resistances of feedback resistors 203 and 204 in the differential amplifier 200B.

The current value of the constant current source in the DC-dummy 10C is half the current value of the constant current source in the differential amplifier 200B. That is, the collector current $I_C$ of the transistor 44 is half the collector current of the transistor 43.

Therefore, the size of the transistor 44 is half the size of each of other three transistors 41 to 43. The resistance of the resistor 48 is equal to the double resistance of each of resistors 45 to 47.

In order to obtain the uniformity of the current-mirror circuit, it is required to arrange transistors 41 to 44 and resistors 45 to 48 near the position.

In like manner, the transistor 11 in the DC-dummy 10C and each of transistors 201 and 202 in the differential amplifier 200B are arranged near the position. Each of load resistors 12, 205 and 206 are arranged near the position. In the constitution, it is possible that the DC characteristics of DC-dummy 10C are equal to the DC characteristics of the amplifying unit 150B.

That is, all of collector voltages of transistors 11, 201 and 202 are equal when no signal is applied to the input terminals 151 of the amplifying unit 150B.

In the level-shifter 20B and the level-shift circuit 300B, transistors 50 to 53 are arranged near the position. Resistors 54 to 57 are arranged near the position, too. Transistors 21, 301 and 302 are arranged near the position. The diode groups 22, 303 and 304 are arranged near the position. The DC characteristics of the level-shifter 20B are equal to the DC characteristics of the level-shift circuit 300B.

Let's suppose that no signal is applied to the input terminal 151 of the amplifying unit 150B. The output voltage from the level-shifter 20B is equal to the common-mode output voltage Vocom from the output terminals 162 of the level-shift circuit 300B. The operational amplifier 30 delivers the output by the feedback control so as to set the output voltage from the output terminals 162 to 0V. The common-mode output voltage Vocom from the output terminals 162 is, therefore, kept at 0V.

It will be evident that the operation is similarly executed when a signal with an excessive amplitude is applied to the input terminals 151 of the amplifying unit 150B. Even if differential amplifiers 100B and 200B are saturated, the DC-dummy 10C and the level-shifter 20B are not affected in operation. The same operation can be executed in spite of the irregularities of the resistances of load resistors 205 and 206.

Thus, according to the present invention, the common-mode output voltage Vocom is set to 0V by a simply constituted circuit. Therefore, in spite of excessive inputs or irregular resistances of load resistors, the amplifying circuit with the level-shift circuit can deliver the distortionless output.

In the above description with reference to FIG. 9, the size of the transistor 11 is equal to the size of each of transistors 201 and 202 in the differential amplifier 200B. The size of the transistor 21 is equal to the size of each of transistors 301 and 302 in the level-shift circuit 300B. In case that the equality of temperature characteristics is severely required, it is desirable that these sizes are equal.

The collector current $I_{44}$ of the transistor 44 is half the collector current $I_{43}$ of the transistor 43. That is, the size of the transistor 44 is half the size of the transistor 43. The collector current $I_{51}$ is equal to the collector current $I_{52}$ or $I_{53}$ of the transistor 52 or 53.

However, the present invention is not restricted to such cases. The present invention can be applied in spite of that the transistors 11, 201, 202, 21, 301 and 302 are not equal in sizes, too. The present invention is applicable notwithstanding that each of collector currents in the current-mirror circuit is not equal.

For example, in case of that the small power dissipation of the whole circuit is required, a quarter sized transistor 44 is usable in which the size of the transistor 44 is equal to a quarter of that of each other three transistors 41 to 43. The resistance of the resistor 48 connected to the emitter of the transistor 44 is four times the resistance of each of the other resistors 45 to 47.

In the case, collector current $I_{11}$ of the transistor 11 in the DC-dummy 10C is half the collector current $I_{201}$ or $I_{202}$ of each of the transistor 201 or 202. That is, the size of the transistor 11 in the DC-dummy 10C is half the size of each of transistors 201 or 202 in the differential amplifier 200B.

The collector current value $I_{44}$ of the transistor 44 is set to a quarter of current value of each of constant current sources in differential amplifiers 100B and 200B. Namely, the current value of the constant current source in the DC-dummy 10C is a quarter of the current value of each of constant current sources in differential amplifiers 100B and 200B.

In such a case, the resistance of the load resistor 12 in the DC-dummy 10C is equal to a double resistance of each of load resistors 205 or 206 in the differential amplifier 200B. The resistance of the feedback resistor 13 is equal to a double resistance of each of feedback resistors 203 or 204.

Then, the collector voltage of the transistor 11 in the DC-dummy 10C is equal to that of each of transistors 201 or 202. Furthermore, let's suppose that the size of the transistor 51 is equal to a quarter of the size of each of other three transistors 50, 52 or 53. The resistance of the resistor 55 connected to an emitter of the transistor 51 is four times resistance of each of the other resistors 54, 56 or 57.

Moreover, let's suppose that the size of the transistor 21 in the level-shifter 20B is equal to a quarter of the size of each of the transistors 301 or 302 in the level-shift circuit 300B. The size of each of the diodes in the diode group 22 is a quarter of that of each of diode groups 303 or 304 in the level-shift circuit 300B.

Then, the output voltage from the level-shifter 20B is equal to the common-mode output voltage Vocom from the output terminals 162 of the level-shift circuit 300B.

When constituted as the above-mentioned, the smaller current value is employable. The smaller power dissipation of the whole circuit is obtainable. It is causes the smaller area size of the circuit. It is very useful for producing integrated circuits.

It is easy that the DC-dummy 10C is arranged near the position of the differential amplifier 200B. It is, also, easy that the level-shifter 20B is arranged near the position of the level-shift circuit 300B. Consequently, the uniform temperature characteristics of those elements are obtainable.

In the above-mentioned, the ratio of the current of each of constant current sources is set as 1 to 4. However, the present invention is not restricted to such a case. Any current ratio can be set. However, in practice, it is necessary to minimize the sizes of transistors when very high ratio of currents is set up. Then, there are several problems to make a sacrifice of accuracies and to need high resistances. It is, accordingly, required to set up a suitable ratio of the currents.

In the case set forth above, the common-mode output voltage Vocom is set to 0V. However, the present invention is not restricted to such a case. It will be evident that any common-mode output voltage Vocom other than 0V can be set, by means of a voltage other than 0V applied to the positive input terminal of the operational amplifier 30.

In the above-mentioned description, each of amplifying units 150 and 150B is consisted of two stages of the differential amplifiers 100 and 200 or 100B and 200B cascadedly connected. However, the present invention is not restricted to such a case. Three or more stages of differential amplifiers are employable in the above-mentioned embodiments.

In the above-mentioned case, npn transistors are employed. The present invention is not, however, restricted to such a case. In stead of npn transistors, FETs (Field Effect Transistors) are usable.

In the level-shifters 20 and 20B and the level-shift circuits 300 and 300B, n diodes are connected in series as a constant voltage diode. However, the present invention is applied to the case that a resistor is employable in stead of the n diodes.

According to the present invention, a common-mode output voltage from differential output terminals of an amplifying circuit with the level shift circuit is kept constant. Then, distortionless output is obtainable in spite of an excessive input applied to an amplifying circuit or irregularities of resistances of load resistors.

For example, an amplifying circuit used in an oscilloscope of the prior art was saturated by being applied with an excessive amplitude input causing to display over the screen. In the case, it was not possible to observe a waveform until the lapse of time.

By using the amplifying circuit with the level-shift circuit in accordance with the present invention in an oscilloscope, those prior art defects are eliminable.

Furthermore, the amplifying circuit with the level-shift circuit in accordance with the present invention can be easily formed as an integrated circuit. Therefore, the present invention has the advantage to be able to miniaturize a circuit.

What is claimed is:

1. An amplifying circuit with a level-shift circuit comprising:
    an amplifying unit means for amplifying a differential input signal applied to a pair of differential input terminals in a differential amplifier of a first stage of at least one differential amplifier so as to obtain a differential output from a pair of differential output terminals in a differential amplifier of a last stage of the at least one differential amplifier,
    a level-shift means including a couple of level-shifters for shifting a DC level of the differential output of the amplifying unit means so as to deliver a shifted differential output from the pair of differential output terminals,
    a DC-dummy means for dummying DC operations of the last stage differential amplifier which has a common power supply with the last stage differential amplifier,
    a level-shifter means having the same constitution as one of the couple of level-shifters for shifting an output level from the DC-dummy means so as to obtain a shifted dummy output, and
    a common power supply means for supplying a controlled voltage applied to the last stage differential amplifier and the DC-dummy means so as to keep the shifted dummy output constant.

2. An amplifying circuit with a level-shift circuit according to claim 1, wherein the DC-dummy means includes a load resistor, a transistor of which collector is connected to the load resistor, a feedback resistor connected to an emitter of the transistor, a constant current source connected to the feedback resistor, a negative voltage source connected to the constant current source and a reference voltage source applied to a base of the transistor.

3. An amplifying circuit with a level-shift circuit according to claim 1, wherein the DC-dummy means includes two load resistors, two transistors of which collectors are respectively connected to the two load resistors, two feedback resistors respectively connected to emitters of the two transistors, a constant current source connected to the two feedback resistors, a negative voltage source and a reference voltage source supplied to bases of the two transistors.

4. An amplifying circuit with a level-shift circuit according to claim 1, 2 or 3, wherein the amplifying unit means, the level-shift means, the DC-dummy means, the level-shifter means and the common power supply means are included in an integrated circuit.

5. An amplifying circuit with a level-shift circuit according to claim 4, wherein a size of the transistor in the DC-dummy means is equal to a size of each of transistors in the amplifying unit, and a size of a transistor in the level-shifter means is equal to a size of each of transistors in the level-shift circuit means on a pattern of the integrated circuit.

6. An amplifying circuit with a level-shift circuit according to claim 4, wherein a size of the transistor in the DC-dummy means is one Nth of a size of each of transistors in the amplifying unit means in which N is an integral number greater than 2, and a size of the transistor in the level-shifter means is one Nth of a size of each of transistors in the level-shift circuit means in which N is an integral number greater than 2.

* * * * *